United States Patent [19]

Sakakima et al.

[11] Patent Number: 5,715,121
[45] Date of Patent: Feb. 3, 1998

[54] MAGNETORESISTANCE ELEMENT, MAGNETORESISTIVE HEAD AND MAGNETORESISTIVE MEMORY

[75] Inventors: Hiroshi Sakakima, Tsuzuki-gun; Yousuke Irie, Kadoma, both of Japan

[73] Assignee: Matsushita Electric Industrial Co., Ltd., Osaka-fu, Japan

[21] Appl. No.: 768,466

[22] Filed: Dec. 18, 1996

[30] Foreign Application Priority Data

Dec. 19, 1995 [JP] Japan .................................. 7-330010

[51] Int. Cl.$^6$ ............................ G11B 5/39; G11C 11/15; B32B 7/02
[52] U.S. Cl. ................. 360/113; 365/158; 365/173; 428/213; 428/694 T; 428/694 TM
[58] Field of Search ........................... 360/113; 365/158, 365/173; 428/213, 694 T, 694 TM

[56] References Cited

U.S. PATENT DOCUMENTS

| | | |
|---|---|---|
| 5,390,061 | 2/1995 | Nakatani et al. . |
| 5,432,734 | 7/1995 | Kawano et al. . |
| 5,463,516 | 10/1995 | Valet et al. . |
| 5,510,172 | 4/1996 | Araki et al. . |
| 5,514,452 | 5/1996 | Araki et al. . |

FOREIGN PATENT DOCUMENTS

| | | |
|---|---|---|
| 59-117729 | 7/1984 | Japan . |
| 5-143940 | 6/1993 | Japan . |
| 6-203333 | 7/1994 | Japan . |
| 6-215335 | 8/1994 | Japan . |
| 7-272224 | 10/1995 | Japan . |
| 7-320231 | 12/1995 | Japan . |

OTHER PUBLICATIONS

Journal of Magnetism and Magnetic Materials, "1 Mb Memory Chip Using Giant Magnetoresistive Memory Cells, " vol. 126, No. 1–03, pp. 524–526, Sep. 1, 1993.
Journal of Magnetism and Magnetic Materials, "Dependence of Magnetoresistanc on Temperature and Applied Voltage in a 82Ni–Fe/Al–Al$_2$O$_3$ /Co Tunneling Junction," vol. 126, No. 1–03, pp. 430–432, Sep. 1, 1993.

*Primary Examiner*—A. J. Heinz
*Attorney, Agent, or Firm*—Wenderoth, Lind & Ponack

[57] ABSTRACT

A magnetoresistance element has a structure of a magnetic film 3, a nonmagnetic film 2 and a magnetic film 1 layered successively, and the nonmagnetic film is made of a mixture of electrical conductors and insulators. Then, magnetic coupling between the magnetic films 1 and 3 is reduced. Further, because it is possible to detect a magnetic field by supplying a current along a film plane, a large change in magnetoresistance is observed, or the sensitivity is high. Modified magnetoresistance elements are also described including a film 4 suppressing magnetization reversal or an interface magnetic film 5. A magnetic head for a hard disk is produced by adding a yoke to the magnetoresistance element. A memory device having a plurality of magnetoresistance elements is produced by adding word lines and the like thereto.

20 Claims, 4 Drawing Sheets

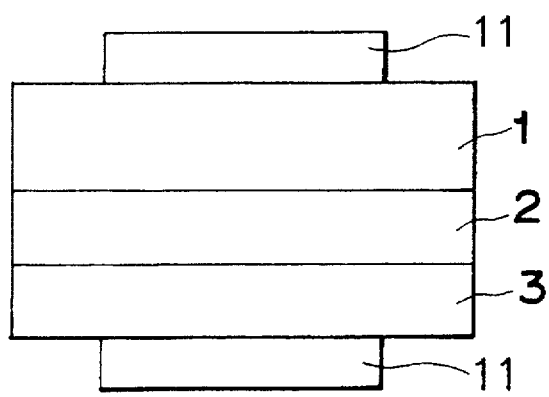
Fig. 1
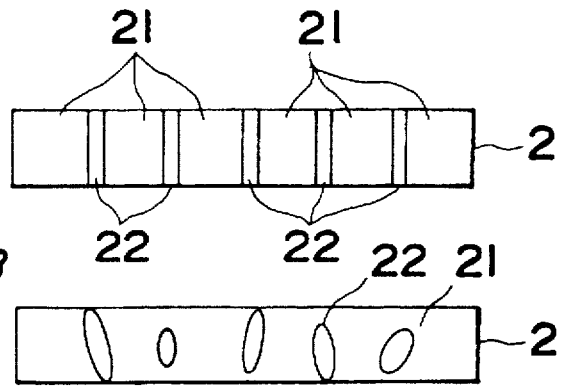
Fig. 2A
Fig. 2B
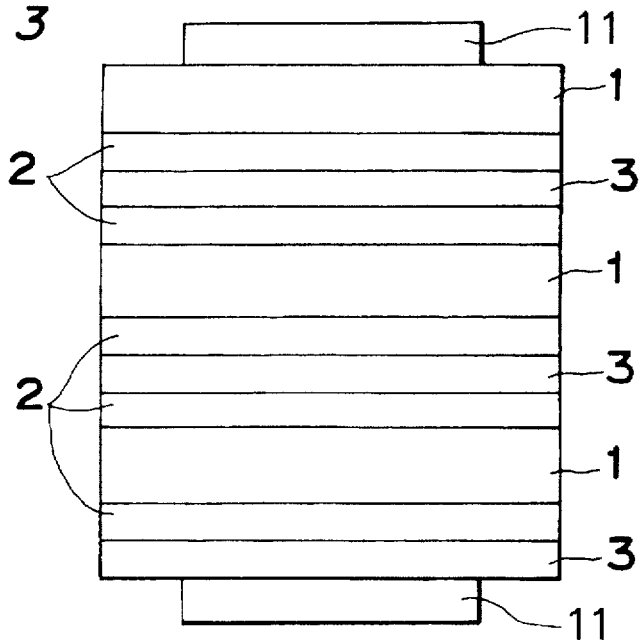
Fig. 3

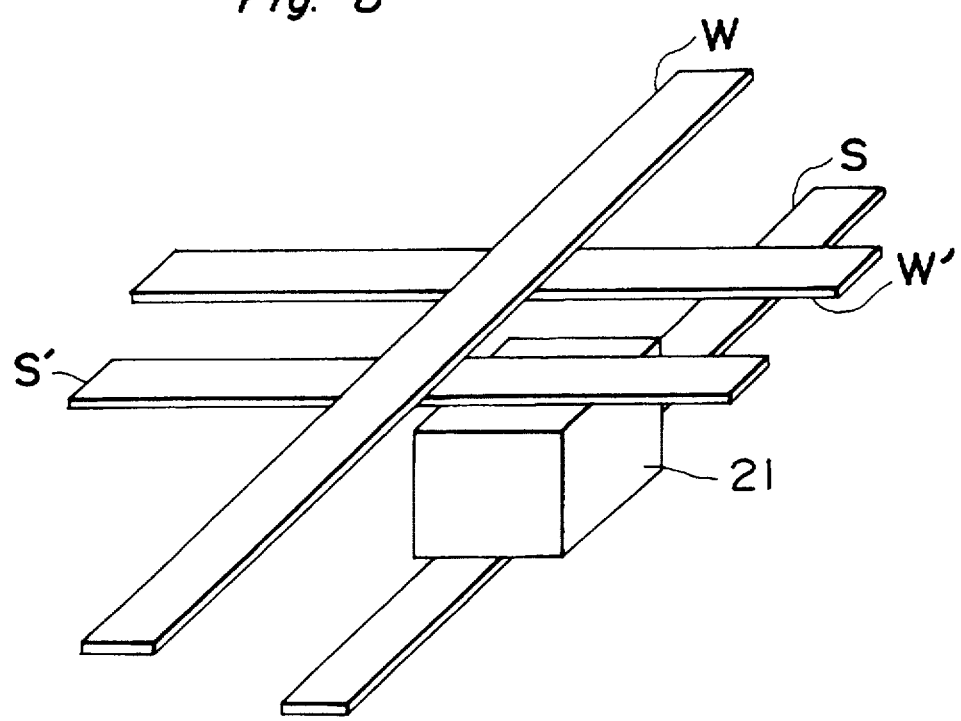

MAGNETORESISTANCE ELEMENT, MAGNETORESISTIVE HEAD AND MAGNETORESISTIVE MEMORY

BACKGROUND OF THE INVENTION

1. Field of the Invention

The present invention relates to devices using magnetoresistance effect such as a magnetoresistance element, a magnetoresistive head for a hard disk and a magnetoresistive memory device.

2. Description of the Prior Art

Recently, a giant magnetoresistance effect is found in strong magnetic field of 1–10 kOe on Fe/Cr or Co/Ru artificial lattice films having antiferromagnetic coupling via a metallic nonmagnetic thin film of Cr, Ru or the like (Physical Review Letters Vol. 61, 2472 (1988), ibid. Vol. 64, 2304 (1990)). However, though these films have large change in magnetoresistance (MR), a magnetic field as high as a few kOe is needed to generate the magnetoresistance effect because these magnetic films are coupled antiferromagnetically.

Further, a giant magnetoresistance is also discovered on Ni—Fe/Cu/Co artificial lattice film using two kinds of magnetic thin films Ni—Fe and Co separated by a metallic nonmagnetic thin film Cu and having weak magnetic coupling between them. A magnetoresistance ratio is about 8% in an applied magnetic field of 0.5 kOe at room temperature (Journal of Physical Society of Japan Vol. 59, 3061 (1990)). However, even in this case, it is difficult to vanish magnetic coupling between magnetic films completely, and it is a problem to develop a magnetoresistance element having a large change in magnetoresistance in a weaker magnetic field.

A large change in magnetoresistance is observed when a current is flown perpendicularly to a film plane of an artificial lattice film. However, because the film thickness is very thin, the resistance along the direction of film plane is very low, and the film cannot be used practically.

As a magnetoresistance element operating in a very small applied field, a spin valve element is proposed having antiferromagnetic Fe—Mn applied to Ni—Fe/Cu/Ni—Fe (Journal of Magnetism and Magnetic Materials 93, 101 (1922)), and an application thereof to a magnetoresistive head is examined. However, it is a problem that a change in magnetoresistance of the element is as small as 2–4%.

A tunneling magnetoresistance element having an insulator film inserted between two magnetic films is developed (Japanese Journal of Applied Magnetism Vol. 19, No. 2, 369 (1995), but it is difficult to control the quality of the insulator film so as to have good characteristics reproducibly.

A magnetoresistive memory device is proposed having word lines and sense lines made of a prior art magnetoresistive material (IEEE Trans. Magn. Vol. 27, No. 6, 5520 (1991)). However, because a rate of change in magnetoresistance is small, it is a problem that an output is small when information is read.

SUMMARY OF THE INVENTION

An object of the invention is to provide a device using magnetoresistance effect having a larger change in magnetoresistance in a smaller magnetic field.

A magnetoresistance element according to the invention comprises a plurality of magnetic films and one or more nonmagnetic films, the magnetic films and the one or more nonmagnetic films being layered so that each nonmagnetic film being arranged between a pair of the magnetic films. The nonmagnetic film comprises an electrical insulator film and at least one electrical conductor positioned in the electrical insulator film, or a mixture of an electrical conductor and an electrical insulator. Then, reproducibility of the element of tunneling type having large magnetoresistance effect is improved if compared with a element using only an electrical insulator as the nonmagnetic film. Further, the electrical resistance of the nonmagnetic film can be controlled, and it becomes easy to design a magnetoresistance element. The effect is improved further by using the nonmagnetic film wherein columnar electrical conductors are surrounded by an electrical insulator. The compositions of the magnetic films are optimized to improve the magnetoresistance characteristic.

Preferably, one of a pair of magnetic films adjacent to the nonmagnetic film comprises a soft magnetic film, and the other thereof has a coercive force larger than that of the one of two magnetic layers. The soft magnetic film easy to reverse magnetization in a very small magnetic field is separated by the nonmagnetic film from the other magnetic film hard to reverse magnetization, so as to weaken magnetic coupling between the two magnetic films. Thus, the rotation of magnetization of the soft magnetic film becomes easy. Thus, the magnetoresistance element and magnetoresistive head using magnetoresistance effect can be provided to have a large rate of change in magnetoresistance.

A third magnetic film may be applied to one of a pair of the magnetic films interposing the nonmagnetic film between them. The third magnetic film suppresses magnetization reversal of the one of a pair of the magnetic films. An interface magnetic film of thickness of 1 nm or less and including cobalt as one of main constituent atoms may be provided at an interface between the magnetic film and the nonmagnetic film adjacent thereto.

The above-mentioned magnetoresistance element is applied to a magnetoresistive head. The size of a portion recorded in a magnetic medium is small, and the signal magnetic field from the magnetic medium is small. Then, it is practically effective to have a yoke made of a soft magnetic material in order to guide the magnetic field efficiently to the soft magnetic film.

In the above-mentioned magnetoresistance element, the magnetoresistive head and the memory device according to the invention, the resistance is high in the direction perpendicular to the film plane, and a current can be flown in the direction perpendicular to the film plane. Then, a larger rate of change in magnetoresistance can be obtained.

An advantage of the present invention is that the magnetoresistance element, the magnetoresistive head and the magnetoresistive memory device have a large change in magnetoresistance in a very small magnetic field.

BRIEF DESCRIPTION OF THE DRAWINGS

These and other objects and features of the present invention will become clear from the following description taken in conjunction with the preferred embodiments thereof with reference to the accompanying drawings, and in which:

FIG. 1 is a schematic sectional view of a magnetoresistance element of a type according to the invention;

FIG. 2A is a schematic sectional view of a nonmagnetic film therein, and FIG. 2B is a schematic sectional view of another example of the nonmagnetic film therein;

FIG. 3 is a schematic sectional view of a magnetoresistance element of a modified type according to the invention;

FIG. 8 is a schematic diagram of a memory device according to the invention.

DETAILED DESCRIPTION OF THE PREFERRED EMBODIMENTS

Figure 4:
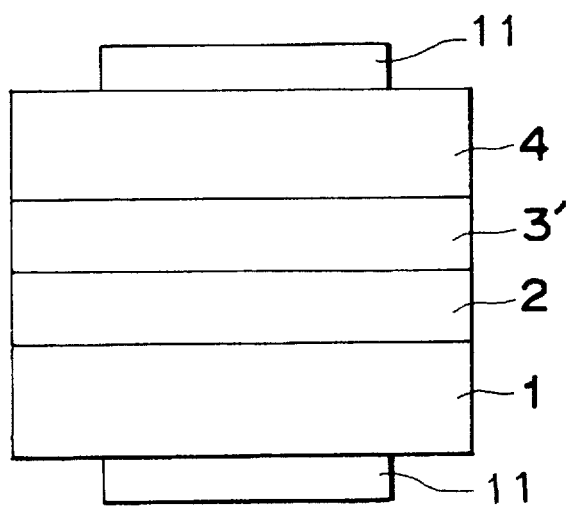
FIG. 4 is a schematic sectional view of a magnetoresistance element of a different type according to the invention.

Referring now to the drawings, wherein like reference characters designate like or corresponding parts throughout the several views, FIG. 1A shows a element having a structure of a magnetic film 3, a nonmagnetic film 2 and a magnetic film 1 layered successively. Further, electrodes 11 are formed at the top of the magnetic film 1 and at the bottom of the magnetic film 3, and leads (not shown) are connected to the electrodes 11. When a very small magnetic field H is applied, the magnetic film 1 having a small coercive force, such as a soft magnetic film, make its magnetization reversed in the applied magnetic field. On the other hand, the other magnetic film 3 having a larger coercive force, such as a hard magnetic film, has a magnetization not reversed in the applied magnetic field. Thus, the directions of the magnetization of the two magnetic films 1 and 3 become antiparallel, and the resistance of the element is increased. When the applied magnetic field is increased further, the directions of the magnetization of the two magnetic films 1, 3 become parallel, and the resistance is decreased. This is the principle of the magnetoresistance element. However, if the nonmagnetic film is made of a metal, it is difficult to vanish the magnetic coupling between the magnetic films 1 and 3, and if the thickness of the nonmagnetic film 2 is increased, the magnetic coupling is weakened, but the rate of change in magnetoresistance is decreased. On the other hand, if the nonmagnetic film is made of an electrical insulator and a current is flown with tunnel effect in the direction perpendicular to a film plane, the reproducibility of the characteristics of the element becomes worse. Then, the nonmagnetic film 2 in this embodiment comprises a mixture of an electrical insulator 21 and an electrical conductor 22, as shown in FIG. 2A. Then, the magnetic coupling between the magnetic films is reduced without deteriorating reproducibility of the characteristics of the element. Preferably, as shown in FIG. 2A, the nonmagnetic film 2 has a structure where columnar electrical conductors 22 are surrounded by an electrical insulator 21.

As shown in FIG. 2B, the nonmagnetic film 2 need not have the structure shown in FIG. 2A. For example, the electrical conductor 22 is not necessarily extended to the magnetic films 1 and 3 when the thickness of the nonmagnetic film 2 is as thin as say 5 nm so that tunneling of electrical charges occur between them. Any distribution of the electrical conductors 22 in the electrical insulator 21 is adopted as far as electrical conduction in the direction of film normal is larger than that in the direction of the film plane.

FIG. 3 shows a modified type of a magnetoresistance element where a plurality of the structures shown in FIG. 1 are layered by interpolating a nonmagnetic film 2 between two magnetic films 1 and 3. In the structure shown in FIG. 3, a first magnetic layer 1, a nonmagnetic layer 2, a second magnetic layer 3, another nonmagnetic layer 2 and another first magnetic layer 1 are layered successively, and one and half of the period is repeated further. Further, electrodes 11 and leads (not shown) are formed at the top and at the bottom of the element. The rate of change in magnetoresistance is improved further, while if a current is flown in a direction of film plane, the sheet resistance of the element is decreased.

An example of fabrication processes of the magnetoresistance element shown in FIG. 1 is explained below. A magnetic film 1 of $Co_{0.7}Ni_{0.1}Fe_{0.2}$ is deposited with sputtering to 12 nm of thickness. Then, a nonmagnetic film 2 is deposited thereon to 2 nm of thickness with a composite target of $Al_2O_3$ and Cu. Further, a magnetic film 3 of $Co_{0.5}Fe0.5$ is deposited thereon with sputtering to 3 nm of thickness. A multi-target sputtering apparatus may also be used to deposit $Al_2O_3$ and copper separately, and self shadowing effect of oblique deposition may also be used. Because $Al_2O_3$ and copper tends to be segregated from each other, and copper grains grow in $Al_2O_3$ in heat treatment in the nonmagnetic film 2.

Magnetoresistance characteristic of the element along a direction vertical to a film plane is measured, and a rate of change in magnetoresistance of 18% is observed in an applied magnetic field of 50 Oe.

Similarly, another magnetoresistance element shown in FIG. 3 is prepared by layering six periods of the structure of a magnetic layer 1, a nonmagnetic layer 2, a magnetic layer 3 and a nonmagnetic layer 2 layered successively. Magnetoresistance characteristic of the element is measured similarly, and a rate of change in magnetoresistance is increased to 24%.

Materials described below are used preferably for the soft magnetic films, the (semi)hard magnetic films and the like for fabricating the above-mentioned magnetoresistance elements.

It is preferable that the soft magnetic film 1, having a small coercive force and easy to generate magnetoresistance and easy to reverse magnetization at a low magnetic field, comprises as a main component a Ni-rich magnetic film including Co or 50% or more. For example, the Ni-rich magnetic film has a composition

wherein

in atomic ratio. Representatives thereof are $Ni_{0.80}Co_{0.15}Fe_{0.05}$ and $Ni_{0.68}Co_{0.20}Fe_{0.12}$. Other soft magnetic film 1 having a larger operating magnetic field, but having a large change in magnetoresistance, comprises as a main component a Co-rich magnetic film including cobalt of 50% or more. For example, the Co-rich magnetic film has a composition $$Ni_{x'}Co_{y'}Fe_{z'} \qquad (2)$$

wherein $$x'=0 \text{ to } 0.4, y'=0.2 \text{ to } 0.95, \text{ and } z=0 \text{ to } 0.5 \qquad (2')$$

in atomic ratio. Representatives thereof are $Co_{0.9}Fe_{0.1}$ and $Co_{0.7}Ni_{0.1}Fe_{0.2}$. These alloys have small magnetostrictions and advantageous to be used for the element.

Though an iron film has non-zero magnetostriction, it has a large rate of change in magnetoresistance. It has a relatively large coercive force or a large coercive force depending on fabrication conditions. Then, an iron film may be used as a soft magnetic film 1 and as a semi-hard magnetic film 3.

An amorphous cobalt alloy such as Co—Mn—B or Co—Mo—B may also be used as the soft magnetic film 1.

The electrical conductor 22 in the nonmagnetic film 2 is preferable made of copper, silver or gold. The electrical insulator 21 in the nonmagnetic film 2 is preferable made of $Al_2O_3$.

It is preferable for a hard or semihard magnetic film 3 to have a rather large coercive force and a square magnetization curve in order to prevent reversal of magnetization. Further, it is preferable that the magnetic film 3 includes cobalt as one of main constituent elements in order to show large magnetoresistance effect. Representatives thereof are Co, $Co_{0.5}Fe_{0.5}$ and $Co_{0.75}Pt_{0.25}$.

FIG. 4 shows a different type of a magnetoresistance element having a feature that a magnetization reversal suppressing film 4 is layered on a magnetic film 3'. The element has a structure of the magnetization reversal suppressing film 4, the magnetic film 3', a nonmagnetic film 2 and a magnetic film 1 layered successively. Further, electrodes 11 and leads (not shown) are formed at the top and at the bottom of the element. In this element, the magnetization of the magnetic film 3' is not rotated easily by the existence of the magnetization reversal suppressing film 4, or the magnetization reversal suppressing film 4 suppresses magnetization reversal of the magnetic film 3' adjacent to the film 4. Then, the magnetization reversal suppressing film 4 layered on the magnetic film 3' has a similar role to the magnetic film 3 shown in FIGS. 1 and 3. Then, the magnetic film 3' may be different from or the same as the magnetic film 1.

Any film may be used as the magnetization reversal suppressing film 4 as far as magnetization reversal of the magnetic film 3' is suppressed when applied to the magnetic film 3'. For example, an oxide TbCo, SmCo or a metallic antiferromagnet such as Fe—Mn, Ni—Mn, Cr—Mn, or an oxide antiferromagnet such as NiO or CoO may be used. When an oxide antiferromagnet is used, it is desirable that the thickness thereof is sufficiently thin in order to decrease resistance.

Figure 5:
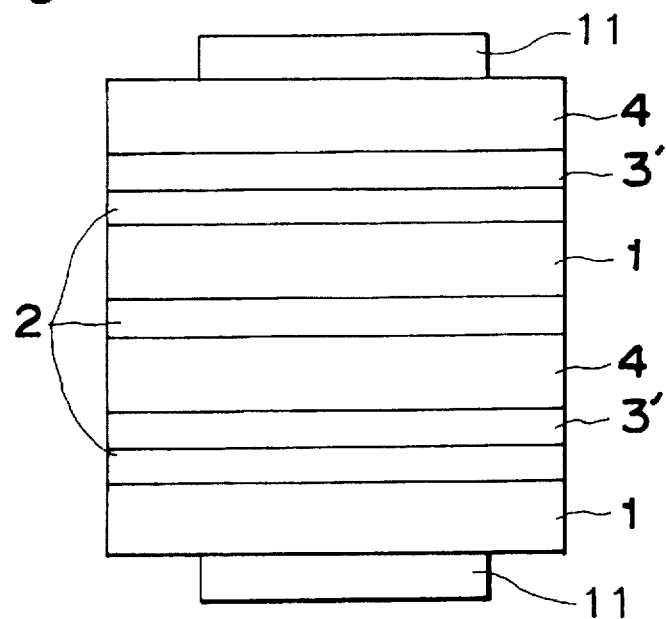
FIG. 5 is a schematic sectional view of a magnetoresistance element of a modified type according to the invention.

FIG. 5 shows a modified type of a magnetoresistance element where a plurality of the structures shown in FIG. 4 are layered by inserting a nonmagnetic film 2 between two structures. In the example shown in FIG. 5, two structures are layered with a nonmagnetic film 2 between them. Further, electrodes 11 and leads (not shown) are formed at the top and at the bottom of the element.

Figure 6A:
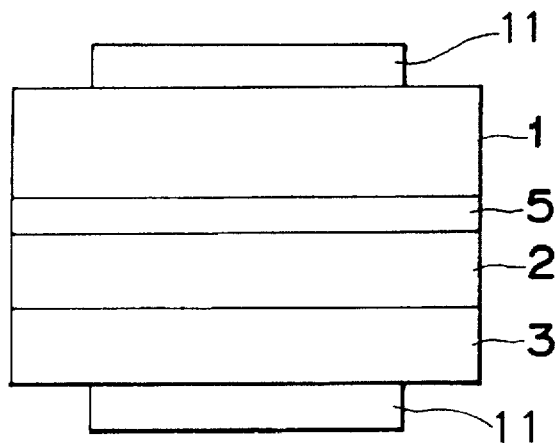
FIGS. 6A and 6B are schematic sectional views of magnetoresistance elements of a still different type according to the invention.
Figure 6B:
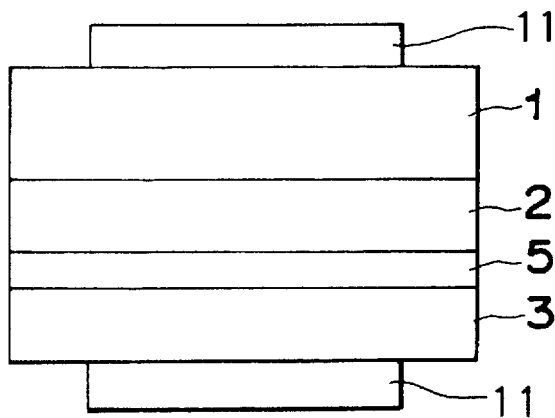

FIGS. 6A and 6B show a still different type of a magnetoresistance element having a feature that an interface magnetic film 5 is provided at an interface between a magnetic film 1 and a nonmagnetic film 2. The interface magnetic film 5 is a film which enhances magnetoresistance effect. For example, the interface magnetic film 5 has a thickness of 1 nm or less and includes cobalt as one of main constituent elements. The enhancing effect of the interface magnetic film saturates with increasing film thickness. If the film thickness exceeds 1 nm, it deteriorates soft magnetic characteristic if it is applied to a soft magnetic film. In an example shown in FIG. 6A, an interface magnetic film 5 is inserted between the magnetic film 1 having a small coercive force, such as a soft magnetic film, and the nonmagnetic layer 2, while in another example shown in FIG. 6B, an interface magnetic film 5 is inserted between the nonmagnetic film 2 and the magnetic film 3 having a larger coercive force, such as a hard magnetic film. Further, electrodes 11 and leads (not shown) are formed at the top and at the bottom of the element. By providing the interface magnetic film 5, a larger rate of change in magnetoresistance is observed.

A cobalt thin film is advantageous as the interface magnetic film 5 in order to increase a rate of change in magnetoresistance. When the film 5 is provided at an interface between the magnetic film 1 and the nonmagnetic film 2, it is preferable that the thickness thereof is 1 nm or less in order to prevent deterioration of soft magnetism of the magnetic film 1.

The interface magnetic film may also be added to the magnetoresistance shown in FIGS. 4 and 5 having the magnetization reversal suppressing film 4 between the nonmagnetic film 2 and the magnetic film 3'.

Figure 7:
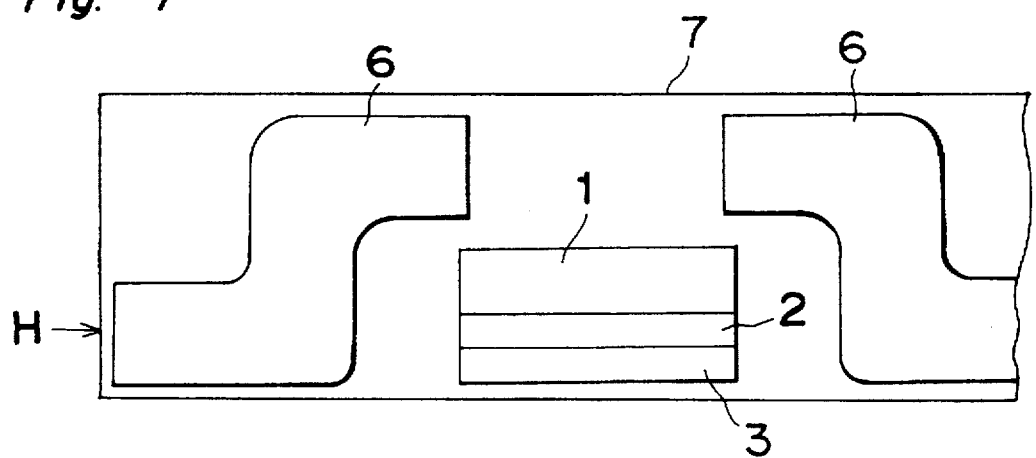
FIG. 7 is a schematic sectional view of a magnetic head for a hard disk according to the invention.

FIG. 7 shows an example of a magnetic head 7 of magnetoresistance effect type used for a hard disk. A signal magnetic field from a magnetic medium is guided by a yoke 6 to the magnetoresistance element. The magnetoresistance element used in the magnetic head has the structure, shown in FIG. 1, of a magnetic film 3, a nonmagnetic film 2 and a magnetic film 1 layered successively. Preferably, the yoke 6 has a width and a thickness in correspondence to a shape of a minute signal area to guide the signal magnetic field H to the soft magnetic film 1 in the magnetoresistance element. In order to guide the magnetic flux efficiently, the yoke 6 is made of a soft magnetic material having a high permeability. Further, it is desirable that the other magnetic film 3 than the soft magnetic film 1 has a large coercive force and magnetization curve of good square shape in order to prevent reversal of magnetization in the signal magnetic field.

An example of fabrication processes of the magnetoresistive head is explained below. A magnetic film 1 of $Ni_{0.68}Co_{0.12}Fe_{0.12}$ is deposited with sputtering to 12 nm of thickness. Then, a nonmagnetic film 2 is deposited thereon to 2 nm of thickness with a composite target of $Al_2O_3$ and Cu. Further, a magnetic film 3 of $Co_{0.5}Fe_{0.5}$ is deposited thereon with sputtering to 3 nm of thickness. Magnetoresistance characteristic of the element along a direction vertical to a film plane is measured in an applied magnetic field of 20 Oe, and a rate of change in magnetoresistance of 12% is observed. Further, after $SiO_2$ is sputtered thereon to form an insulating film (not shown), a $Co_{0.82}Nb_{0.12}Zr_{0.06}$ film is formed with sputtering, and a yoke 6 is formed by patterning the film. Further, electrodes and leads (not shown) are provided to each magnetic film. Thus, a magnetoresistive head 7 using magnetoresistance is prepared. After $Co_{0.5}Fe_{0.5}$ is magnetized in one direction by applying magnetic field of 500 Oe to the head 7 in a Helmholtz coil, an output signal of the head 7 is measured in a magnetic field generated in the opposite direction. It is found that the output of the head 7 is six times that of a head which is the same except that a Ni—Fe film of a prior art magnetoresistance material is used.

The magnetic film 7 used for the yoke 6 needs to be a soft magnetic film having a high permeability. This condition is satisfied by a cobalt amorphous alloy film of $Co_{0.82}Nb_{0.12}Zr_{0.06}$ or the like or $Ni_{0.8}Fe_{0.2}$.

FIG. 8 shows an example of a memory device, where a magnetoresistance element 21 is connected to leads forming a pair of sense lines S, S', and a pair of word lines W, W' for reading information are provided near the magnetoresistance element 21 via an insulating film (not shown). The sense lines S, S' are connected electrically to the top and to the bottom of the magnetoresistance element 21. Thus, the direction of current flowing through the magnetoresistance element 21 is substantially perpendicular to the film plane of the element 21. Only one magnetoresistance element 21 is shown in FIG. 8 for the ease of explanation. However, though not shown explicitly, a plurality of magnetoresistance elements 21 is arranged as a two-dimensional matrix. The sense lines S are arranged in parallel to each other and cross the sense lines S' perpendicularly. The word lines W are arranged in parallel to each other and cross the word lines W' perpendicularly. The magnetoresistance element 21 may have a structure of the above-mentioned magnetoresistance elements, for example, the structure shown in FIG. 1 of a magnetic film 3, a nonmagnetic film 2 and a magnetic film 1 layered successively. Information is recorded by supplying a current to the word lines W, W' to generate a magnetic field to reverse the magnetization of the magnetic film 3 having a larger coercive force. Information is read by detecting a change in magnetoresistance in the magnetoresistance element 21 with the sense lines S, S' while supplying a weak current to the word lines W, W' to reverse the magnetization of only the soft magnetic film 1. In this memory device, the magnetic film 3 having a larger coercive force has to reverse magnetization by the magnetic field generated by the word lines W, W'. Because this becomes difficult when the coercive force is too large, it is desirable that the magnetic film 3 comprises a semihard magnetic film having coercive force of an appropriate magnitude. Further, in order to detect the record state of information clearly, it is desirable that the squareness of the magnetization curve of the semihard magnetic film 3 is good.

If the magnetoresistance element 21 has a structure of a magnetization reversal suppressing film 4, a magnetic film 3', a nonmagnetic film 2 and a magnetic film 1 layered successively, shown in FIG. 4 or 5, and the magnetization reversal suppressing film 4 is made of an antiferromagnetic material, it becomes difficult in many cases to reverse magnetization of the magnetic film 3' in a magnetic field generated by the word lines W, W'. In these cases, information is recorded by supplying a current to the word lines W, W' to reverse magnetization of the magnetic film 1, and information is read also by supplying a current to the word lines W, W' to reverse magnetization of the magnetic film 1. Then, destructive read is performed in this case in contrast to nondestructive read in the former case.

An example of fabrication processes of the memory device using the magnetoresistance element shown in FIG. 1 is explained below. First, gold is deposited and patterned as stripes in parallel as sense lines S. Then, a plurality of magnetoresistance elements 21 is formed on the sense lines S. For example, a magnetic film 1 of $Ni_{0.8}Fe_{0.2}$ is deposited with sputtering to 10 nm of thickness. Then, a nonmagnetic film 2 is deposited thereon to 5 nm of thickness with a composite target of $Al_2O_3$ and Cu. Further, a magnetic film 3 of Co is deposited thereon with sputtering to 5 nm of thickness. Magnetoresistance characteristic of a magnetoresistance element of this structure along a direction vertical to a film plane is measured, and a rate of change in magnetoresistance of 10% is observed in an applied magnetic field of 20 Oe. Alternatively, a magnetoresistance element is prepared by layering six periods of a structure of a magnetic layer 1, a nonmagnetic layer 2, a magnetic layer 3 and a nonmagnetic layer 1 layered successively, as shown in FIG. 3. Magnetoresistance characteristic is measured similarly, and a rate of change in magnetoresistance of 16% is observed.

Further, gold is deposited and patterned as stripes in parallel to form sense lines S' on the magnetoresistance elements 21 perpendicularly to the sense lines S. Then, $SiO_2$ is sputtered thereon to form an insulating film, and gold is deposited thereon. Word lines W' are formed with patterning of the gold film. This process is repeated to form word lines W perpendicular to the word lines W'. Thus, a memory device is fabricated. After the magnetic film 3 is magnetized in one direction by supplying a current in the word lines W, W', a weak current is supplied in the word lines W, W' to generate a weak magnetic field in the opposite direction to the magnetization of the magnetic film 3, in order to magnetize only the magnetic film 1 while measuring resistance change between a pair of the sense line S, S'. An output change is observed. On the other hand, when a weak current is supplied to a pair of the word lines W, W' to generate a weak magnetic field in the direction of the magnetization of the magnetic film 3, no change between a pair of the sense line S, S' is observed. Thus, the fabricated device is found to operate as a memory device. Further, when a weak current is supplied repeatedly in a pair of the word lines W, W' to read information, similar output changes are observed. Thus, it is found that nondestructive reading is possible. The leads of the word lines W, W' and the sense lines S, S' are preferably made of a metal such as gold or copper having a low resistance.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A magnetoresistance element comprising a plurality of magnetic films and one or more nonmagnetic films, said magnetic films and said one or more nonmagnetic films being layered so that each nonmagnetic film being arranged between a pair of said magnetic films, wherein said nonmagnetic film comprises an electrical insulator film and at least one electrical conductor positioned in said electrical insulator film.

2. The element according to claim 1, wherein one of a pair of magnetic films adjacent to said nonmagnetic film comprises a soft magnetic film, and the other thereof has a coercive force larger than that of said one of two magnetic films.

3. The element according to claim 1, further comprising a third magnetic film applied to one of a pair of said magnetic films interposing said nonmagnetic film between them, said third magnetic film suppressing magnetization reversal of said one of a pair of said magnetic films.

4. The element according to claim 3, wherein said magnetic film adjacent to said third magnetic film comprises cobalt of 50% or more and said magnetic film not adjacent to said third magnetic film comprises nickel of 50% or more.

5. The element according to claim 3, wherein said third magnetic film is made of an antiferromagnetic material.

6. The element according to claim 1, further comprising an interface magnetic film of thickness of 1 nm or less and including cobalt as one of main constituent atoms, said interface magnetic film being provided at an interface between said magnetic film and said nonmagnetic film adjacent to said magnetic film.

7. The element according to claim 3, further comprising an interface magnetic film of thickness of 1 nm or less and including cobalt as one of main constituent atoms, said interface magnetic film being provided at an interface between said magnetic film and said nonmagnetic film adjacent to said magnetic film.

8. The element according to claim 1, wherein said nonmagnetic film comprises an electrical insulator film and a plurality of columnar electrical conductors therein.

9. The element according to claim 3, wherein said nonmagnetic film comprises an electrical insulator film and a plurality of columnar electrical conductors therein.

10. The element according to claim 1, wherein one of said magnetic films comprises a soft magnetic film having $Ni_x$-$Co_y Fe_z$ as a main component wherein x is 0.6 to 0.9, y is 0 to 0.4 and z is 0 to 0.3 in atomic composition ratio.

11. The element according to claim 1, wherein one of said magnetic films comprises a soft magnetic film having $Ni_x$-$Co_y Fe_z$ as a main component wherein x is 0 to 0.4, y is 0.2 to 0.95 and z is 0 to 0.5 in atomic ratio.

12. The element according to claim 1, wherein one of said magnetic films comprises an amorphous alloy film having cobalt as a main component.

13. The element according to claim 2, wherein said soft magnetic film comprises a magnetic film having $Ni_x Co_y Fe_z$ as a main component wherein x is 0.6 to 0.9, y is 0 to 0.4 and z is 0 to 0.3 in atomic ratio, and said magnetic film having a coercive force larger than said magnetic film comprises a magnetic film having cobalt as a main constituent atom.

14. The element according to claim 2, wherein said soft magnetic film comprises a magnetic film having $Ni_x Co_y Fe_z$ as a main component wherein x is 0 to 0.4, y is 0.2 to 0.95 and z is 0 to 0.5 in atomic ratio, and said magnetic film having a coercive force larger than said magnetic film comprises a magnetic film having cobalt as a main constituent atom.

15. The element according to claim 2, wherein said soft magnetic film comprises an amorphous alloy film having cobalt as a main component, and said magnetic film having a coercive force larger than said amorphous film comprises a magnetic film having cobalt as a main constituent atom.

16. The element according to claim 1, wherein said electrical conductor in said nonmagnetic film is made of one or more elements selected in a group of copper, silver and gold.

17. The element according to claim 1, wherein said electrical insulator film in said nonmagnetic film is made of an aluminum oxide.

18. A magnetoresistive head comprising:

a magnetoresistance element comprising a plurality of magnetic films and one or more nonmagnetic films, said magnetic films and said one or more nonmagnetic films being layered so that each nonmagnetic film being arranged between a pair of said magnetic films, wherein said nonmagnetic film comprises an electrical insulator film and at least one electrical conductor positioned in said electrical insulator film; and a yoke for guiding a signal magnetic field from a magnetic medium opposing the magnetoresistive head to said magnetoresistance element.

19. A memory device comprising:

a magnetoresistance element comprising a plurality of magnetic films and one or more nonmagnetic films, said magnetic films and said one or more nonmagnetic films being layered so that each nonmagnetic film being arranged between a pair of said magnetic films, wherein said nonmagnetic film comprises an electrical insulator film and at least one electrical conductor positioned in said electrical insulator film;

a pair of first electrically conductive lines connected electrically to one of said magnetic films located at one end of said magnetoresistance element and to another of said magnetic films located at the other end thereof; and a second electrically conductive line electrically insulated from said magnetoresistance element, said pair of second electrically conductive lines being provided near said magnetoresistance element.

20. The memory device according to claim 19, wherein a plurality of said magnetoresistance elements are arranged as a two-dimensional matrix, and a pair of said conductive lines crossing each other perpendicularly and separated from each other are provided around each of said magnetoresistance elements.

* * * * *